(12) United States Patent
Tanaka et al.

(10) Patent No.: US 7,291,857 B2
(45) Date of Patent: Nov. 6, 2007

(54) NON-VOLATILE MEMORY

(75) Inventors: Hideyuki Tanaka, Hirakata (JP);
Takashi Ohtsuka, Toyonaka (JP);
Kiyoyuki Morita, Yawata (JP); Kiyoshi Morimoto, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 550 days.

(21) Appl. No.: 10/967,222

(22) Filed: Oct. 19, 2004

(65) Prior Publication Data

US 2005/0045864 A1 Mar. 3, 2005

Related U.S. Application Data

(62) Division of application No. 10/608,130, filed on Jun. 30, 2003, now Pat. No. 6,844,564.

(30) Foreign Application Priority Data

| Dec. 12, 2001 | (JP) | ................................ 2001-378311 |
| Jul. 17, 2002 | (JP) | ................................ 2002-208399 |
| Dec. 4, 2002 | (JP) | ........................ PCT/JP02/12691 |

(51) Int. Cl.
*H01L 47/00* (2006.01)

(52) U.S. Cl. ............ 257/4; 257/3; 257/5; 257/E27.004; 257/E45.002

(58) Field of Classification Search .................... 257/3, 257/4, 5, E27.004, E45.002
See application file for complete search history.

(56) References Cited

U.S. PATENT DOCUMENTS

| 5,166,758 | A | 11/1992 | Ovshinsky et al. |
| 5,789,758 | A | 8/1998 | Reinberg |
| 5,912,103 | A | 6/1999 | Ebina et al. |
| 6,287,887 | B1 | 9/2001 | Gilgen |
| 6,329,666 | B1 | 12/2001 | Doan et al. |
| 2002/0131309 | A1 | 9/2002 | Nishihara et al. |

FOREIGN PATENT DOCUMENTS

| JP | 61-229378 | 10/1986 |
| JP | 4-45583 | 2/1992 |

(Continued)

OTHER PUBLICATIONS

Berggren et al., Paper electronics and electronic paper, Oct. 2001, IEEE.

*Primary Examiner*—Andy Huynh
(74) *Attorney, Agent, or Firm*—McDermott Will & Emery LLP

(57) ABSTRACT

A non-volatile memory (1) which comprises an insulating substrate (11) having a plurality of first electrodes (15) extending therethrough from a front surface of the substrate to a rear surface thereof, a second electrode (12) formed on one surface side of the substrate (11), and a recording layer (14) held between the first electrodes (15) and the second electrode (12) and variable in resistance value by electric pulses applied across the first electrodes (15) and the second electrode (12), the plurality of first electrodes (15) being electrically connected to the recording layer (14) in a region constituting a single memory cell (MC). The non-volatile memory (1) can be reduced in power consumption and has great freedom of design and high reliability.

10 Claims, 7 Drawing Sheets

FOREIGN PATENT DOCUMENTS

| | | |
|---|---|---|
| JP | 4-45584 | 2/1992 |
| JP | P2000-509204 A | 7/2000 |
| JP | P2001-504279 A | 3/2001 |
| JP | P2002-540605 A | 11/2002 |
| WO | WO 97/40499 | 10/1997 |
| WO | WO 98/36446 | 8/1998 |
| WO | WO 00/57498 | 9/2000 |

(a)

(b)

(a)

(b)

NON-VOLATILE MEMORY

This application is a divisional of application Ser. No. 10/608,130 filed Jun. 30, 2003, U.S. Pat. No. 6,844,564.

TECHNICAL FIELD

The present invention relates to non-volatile memories, and more particularly to non-volatile memories wherein data can be recorded (written) or is erasable by controlling variations in resistance value due to the passage of current.

BACKGROUND ART

Already known as non-volatile memories are flash memories, FeRAMs, MRAMs, phase-change memories. U.S. Pat. No. 6,172,902, for example, discloses an MRAM incorporated in a membrane, and U.S. Pat. No. 5,166,758 discloses the construction of a phase-change memory.

Since higher densities are required of memories for use in portable information terminals and the like, attention has been directed to phase-change non-volatile memories, and various improvements have been made in such memories [WO97/05665 (Japanese Unexamined Patent Publication No. 1999-510317), WO98/19350 (Japanese Unexamined Patent Publication No. 2001-502848), WO99/54128 (Japanese Unexamined Patent Publication No. 2002-512439, U.S. Pat. No. 6,339,544, U.S. Pat. No. 5,536,947, etc.).

For example, WO98/336446 (Japanese Unexamined Patent Publication No. 2001-504279) discloses, as shown in FIG. 11, a phase-change non-volatile memory comprising a lower electrode 51, an upper electrode 52, and a phase-change material layer 53 which is formed therebetween and through which current can be passed via the electrodes 51, 52. The phase-change material layer 53 comprises a chalcogenide material which is reversibly changeable in phase between an amorphous (noncrystalline) state of high resistance and a crystalline state of low resistance. The material is changed to the noncrystalline state or crystalline state by the passage of current to control the resistance value. For example when data is stored (written), the phase-change material layer 53 is changed from the amorphous state to the crystalline state and thereby given a low resistance value, while when data is to be erased, the layer 53 is changed from the crystalline state to the amorphous state and given a high resistance value. Thus the difference in resistance value is read to use the layer as a memory.

In the construction shown in FIG. 11, a joint portion 51a between the lower electrode 51 and the phase-change material layer 53 is shaped in a frustoconical form to thereby provide an improved current density. The joint portion 51a is formed by undercutting a pattern (not shown) formed on the phase-change material layer 53 by photolithography. After the pattern is removed, the layer 53 is formed on the joint portion 51a by photolithography.

WO97/40499 (Japanese Unexamined Patent Publication No. 2000-509204) also discloses a structure which is similar to the above and in which a joint portion between a lower electrode and a phase-change material layer is tapered toward the phase-change material layer with a decreasing cross sectional area to give a higher current density at the tapered end.

Giving an increased current density in this way is effective from the viewpoint of achieving savings in the electric power of the memory for writing and erasing data. However, if the contact between the electrode and the phase-change material layer is diminished, there arises the problem that faulty conduction is liable to occur between the electrode and the layer to result in a lower yield. The need to form the phase-change material layer accurately at the position where the joint portion 51a is formed further entails the problem of reducing the freedom of design.

DISCLOSURE OF THE INVENTION

An object of the present invention, which has been accomplished to overcome these problems, is to provide a non-volatile memory which can be reduced in power consumption and which is great in the freedom of design and highly reliable.

The above object of the invention is fulfilled by a non-volatile memory which comprises an insulating substrate having a plurality of first electrodes extending therethrough from a front surface of the substrate to a rear surface thereof, a second electrode formed on one surface side of the substrate, and a recording layer held between the first electrodes and the second electrode and variable in resistance value by electric pulses applied across the first electrodes and the second electrode, the plurality of first electrodes being electrically connected to the recording layer in a region constituting a single memory cell.

BEST MODE OF CARRYING OUT THE INVENTION

Embodiments of the present invention will be described below with reference to the accompanying drawings.

FIRST EMBODIMENT

Figure 1:
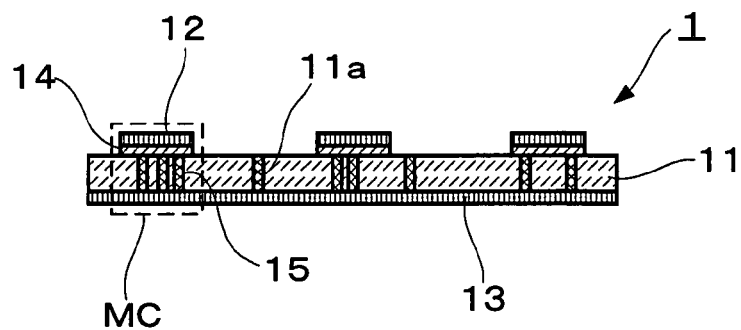
FIG. 1 is a fragmentary view in section of a non-volatile memory according to an embodiment of the invention.
Figure 2:
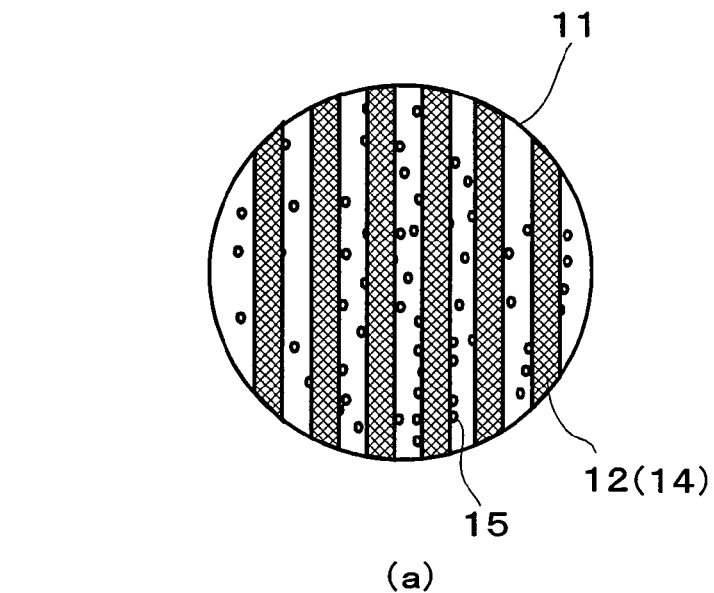
FIG. 2 shows the non-volatile memory of FIG. 1, (a) being a fragmentary plan view, (b) being a fragmentary bottom view.
Figure 2:
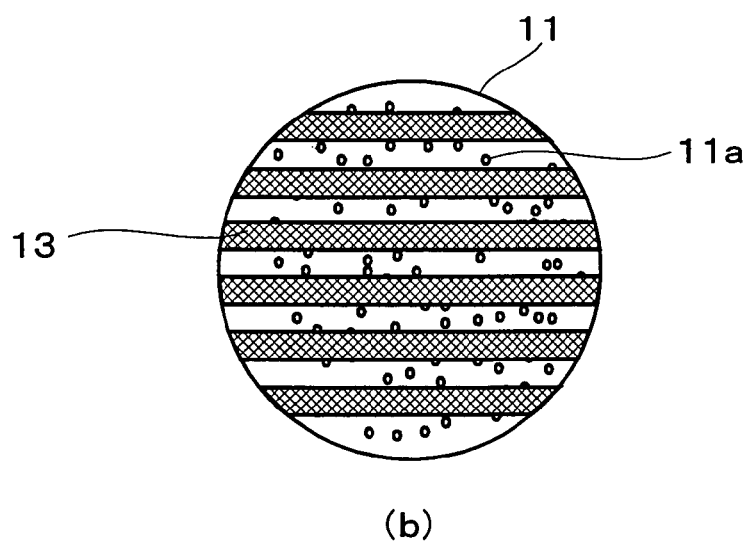

FIG. 1 is a fragmentary view in section of a non-volatile memory according to an embodiment of the invention, and FIG. 2(a) is a fragmentary plan view of the non-volatile memory shown in FIG. 1, and FIG. 2(b) is a fragmentary bottom view of the same. The views (a) and (b) of FIG. 2 are not those showing the same region.

With reference to FIGS. 1 and 2, the non-volatile memory 1 comprises upper electrodes (second electrodes) 12 formed on the front surface side of an insulating substrate 11, and lower electrodes (third electrodes) 13 formed on the rear surface of the substrate 11. The insulating substrate 11 is made, for example, from a polycarbonate, and the upper electrodes 12 and the lower electrodes 13 are prepared, for example, from gold (Au).

The upper electrodes 12 and the lower electrodes 13 are provided in the form of stripes. The upper electrodes 12 and the lower electrodes 13 have their lengths arranged orthogonal to each other when seen from above. The regions where the upper electrodes 12 lap over the lower electrodes 13 when seen from above provide memory cells MC.

The stripes of the upper electrodes 12 and the lower electrodes 13 are provided by strips, whose width is determined by the design rule and is, for example, 15 to 100 μm. The spacing between the strips is preferably 30 to 1000 μm.

As shown in FIG. 1, a recording layer 14 is provided between the upper electrode 12 and the insulating substrate 11. The recording layer 14 comprises a phase-change material having at least two stable phases, reversibly switchable between the phases and controllable in variations of resistance value due to the passage of current. Examples of such materials are Ge—Sb—Te compounds such as $Ge_2Sb_2Te_5$ and $Ge_1Sb_2Te_4$, Ag—In—Sb—Te compounds such as $Ag_5In_5Sb_{70}Te_{20}$, Te—Sb—As compounds such as $Te_{80}Sb_5As_{15}$, Te—Ge—Sb—S compounds such as $Te_{81}Ge1_{15}Sb_2S_2$, Te—Ge—As compounds such as $Te_{93}Ge_5As_2$, Te—Ge—Sn compounds such as $Te_{80}Ge_5Sn_{15}$, Te—Ge—Sn—Au compounds such as $Te_{60}Ge_4Sn_{11}Au_{25}$, GeTe compounds and like chalcogenide compounds.

The insulating substrate 11 has a large number of fine pores 11a extending through the substrate from the front surface thereof to its rear surface. Each of the fine pores 11a which are covered with the lower electrode 13 at their lower ends is filled with an intermediate electrode (first electrode), for example, of rhodium (Rh). The lower electrode 13 is electrically connected to the recording layer 14 by such fine intermediate electrodes 15. The intermediate electrodes 15 in the memory cell MC are covered with the upper electrode 12 from above, and are electrically connected to the upper electrode 12 by the recording layer 14. Thus, the region of each memory cell MC has a plurality of intermediate electrodes 15 via which current can be passed through the recording layer 14.

With the non-volatile memory 1 thus constructed, data can be written to, read from or erased from the desired memory cell MC by selecting the upper electrode 12 and the lower electrode corresponding to the memory cell MC and applying suitable electric pulses across the selected electrodes. Stated more specifically for writing, electric pulses are applied to the electrodes at a predetermined voltage to thereby produce Joule heat, change the recording layer 14 from the amorphous state to the crystalline state and lower the resistance value. For erasing, on the other hand, electric pulses of shorter pulse width than for writing are applied to rapidly cool the recording layer 14 of high temperature, change the layer 14 from the crystalline state to the amorphous state and raise the resistance value. For reading, a voltage lower than for writing and erasing is applied to detect the current value resulting from a variation in the resistance value.

When the voltage-current characteristics of the memory cell MC were determined by applying electric pulses across the upper electrode 12 and the lower electrode 13, asymmetric characteristics were found at varying positive and negative voltages, hence a rectifying effect. Accordingly, data was written to, read from or erased from memory cells by applying electric pulses in the forward direction in which the power consumption is lower. In the case where the recording layer 14 comprises Ge—Sb—Te, and the intermediate electrodes 15 are made from rhodium, the forward direction is such that the intermediate electrodes 15 serve as the positive electrodes, with the recording layer 14 serving as the negative electrode. During application of electric pulses, therefore, the recording layer 14 can be prevented from becoming insulated by effectively precluding the anodic oxidation of the recording layer 14 due to the water remaining in the intermediate electrodes 15 or the water ingressing into the layer 14, for example, through cracks in the insulating substrate 11 or through a clearance between the substrate 11 and the lower electrode 13. To render the recording layer 14 free from anodic oxidation in the case where a forward-direction voltage is applied and when the layer 14 is made from Ge—Sb—Te, examples of preferred materials usable for the intermediate electrode 15 in combination with the material for the layer 14 are platinum (Pt), palladium (Pd), nickel (Ni), cobalt (Co), chromium (Cr), rhenium (Re), iridium (Ir), gold (Au), etc.

With the present embodiment, a plurality of intermediate electrodes 15 are arranged in the region of each memory cell MC, so that even if one or some of the intermediate electrodes 15 fail to properly serve for conduction, for example, due to a break, electric pulses can be applied to the recording layer 14 through the remaining intermediate electrodes 15. Consequently, the intermediate electrodes 15 can be fully reduced in cross sectional area to give an increased current density and achieve a reduction in power consumption while assuring the memory of satisfactory yield and reliability as a product. Because a large number of fine pores 11a for accommodating intermediate electrodes 15 are formed in the insulating substrate, the position where the recording layer 14 is to be provided becomes less likely to be limited. This leads to increased freedom of design.

The non-volatile memory described above is fabricated, for example, by the process to be described below. First, an insulating substrate 11 of polycarbonate having a thickness of 6 μm was prepared which had many fine pores 11a 50 nm in diameter and formed therethrough substantially perpendicular to the surface thereof at a number density of $10^5$ pores/cm². Methods of forming a large number of fine pores in substrates are disclosed, for example, in U.S. Pat. No. 6,060,743 (Japanese Unexamined Patent Publication No. 1999-40809) and Japanese Unexamined Patent Publication No. 1999-170378. Used for the present embodiment was a substrate having a large number of fine pores as arranged randomly and prepared by the step of irradiating a base plate with an ion beam perpendicular to the surface thereof to pass ions through the plate and produce defects in the plate, and the step of selectively etching the defects produced. The substrate thus prepared has conventionally been used as a filter for capturing fine particles present in liquids, formicroscopic observation of fine particles, biochemical examination, environmental measurement, etc. A commercial porous substrate was used for the present embodiment.

Figure 3:
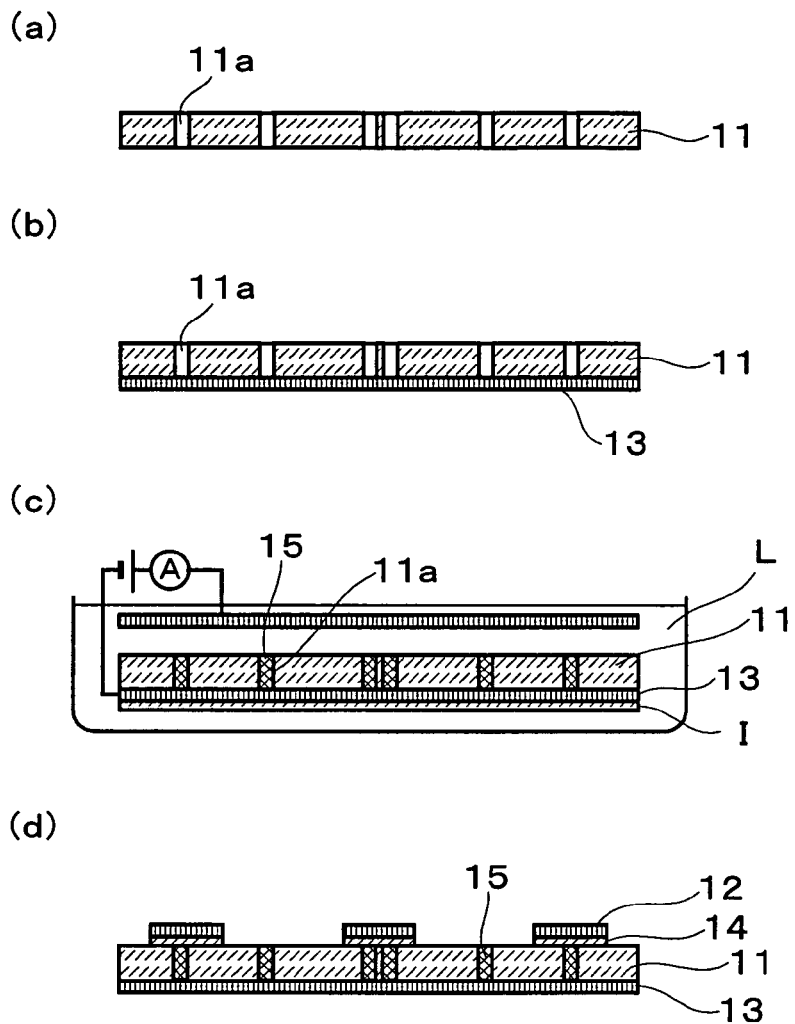
FIG. 3 includes process diagrams for illustrating a process for fabricating the non-volatile memory of the structure shown in FIG. 1.

According to a wiring design rule of 100 μm, Au was then deposited on the rear surface of the insulating substrate 11 to a thickness of 200 nm by sputtering using a metal mask to form lower electrodes 13 in the form of 100-μm-wide stripes as shown in FIG. 3(b). Before the deposition of Au, a thin film of Cr, Ti or like metal can be deposited on the substrate to ensure improved adhesion of the electrodes to the substrate.

Next as shown in FIG. 3(c), the inside walls defining the fine pores 11a were electroplated with Rh using a sulfuric acid Rh plating bath L to form intermediate electrodes 15 in the insulating substrate 11. The lower electrodes 13 were coated with an insulating material so as not to deposit Rh on the surfaces of the electrodes 13 during plating. Although the intermediate electrodes 15 are formed by Rh electroplating according to the present embodiment, electrically conductive materials are usable for plating without limitations if they are excellent in electromigration resistance and oxidation resistance. The intermediate electrode 15 can be formed by plating with platinum (Pt), palladium (Pd), nickel (Ni), cobalt (Co) or the like.

With reference to FIG. 3(d), a memory material comprising Ge—Sb—Te was deposited to a thickness of 10 nm by sputtering on the front surface of the insulating substrate 11 then withdrawn from the Rh plating bath using a metal mask to form recording layers 14, and Au was thereafter deposited on the layers 14 to a thickness of 200 nm by sputtering to form upper electrodes 12 in the form of 100-μm-wide stripes. At this time, a metal mask was placed in an adjusted direction so that the upper electrodes 12 and the lower electrodes 13 would have their lengths arranged orthogonal to each other. It is desired that the insulating substrate be fully dried in order to prevent water on the substrate from remaining in its interior owing to the presence of film formed by sputtering for deposition. According to the present embodiment, the polycarbonate substrate used as the insulating substrate 11 was heated at 120° C. in a vacuum, followed by sputtering for deposition. The process described above afforded a non-volatile memory having a minute electrode structure in conformity with the design rule.

The non-volatile memory thus obtained is usable for writing and erasing by applying electric pulses of 2 to 3 V with a pulse width of 100 ns and pulse current of about 1 mA for writing or with a pulse width of 50 ns and pulse current of about 1.7 mA for erasing. Thus, the power consumption conventionally needed can be greatly reduced. The memory is usable for reading by applying electric pulses of 1 V with pulse current of about 100 nA in the set (ON) state or pulse current of about 1 nA in the reset (OFF) state. Furthermore, the memory cells were found to be satisfactorily high in electromigration resistance when checked for this property. While intermediate electrodes 15 generally have a polycrystalline structure, the intermediate electrodes 15 of the present embodiment have a diameter which is as small as crystal grains, and have diminished grain boundaries at opposite ends of the intermediate electrodes 15, so that the cells are thought to have improved resistance to electromigration. Thus, the intermediate electrodes 15 preferably have the smallest possible diameter which is, for example, 5 to 500 nm.

Prepared for comparison was an assembly comprising a pair of Au electrodes having a width (100 μm) nearly the same as that of the upper and lower electrodes 12, 13 of the non-volatile memory of the present embodiment, a hollow cylindrical intermediate Rh electrode with a diameter of 80 μm which is approximate to the electrode width, and a memory material comprising Ge—Sb—Te, the intermediate electrode and the memory material being held between the Au electrodes. The assembly was checked for operation ability for writing and erasing. Consequently, it was found that the assembly required at least 100 mA for writing and erasing, hence much greater power than the non-volatile memory of the present invention.

According to the present embodiment, a large number of intermediate electrodes 15 having a very small diameter are arranged randomly in the insulating substrate 11, so that recording layers 14 can be formed in desired positions with increased freedom of design. However, the number of intermediate electrodes 15 present in the memory cell varies from cell to cell, and such variations appear as variations in the electric characteristics of the memory cells, entailing the likelihood of influencing the function of the non-volatile memory. Accordingly, the memory cells arranged on the insulating substrate 11 were checked for variations in the electric characteristics.

Since the number density of fine pores 11a in the insulating substrate 11 is $10^5/cm^2$, ten intermediate electrodes 15 are present on the average in the region (100 μm×100 μm) of intersection of the upper electrode 12 and the lower electrode 13 providing each memory cell MC. The fine pores 11a provided with the intermediate electrodes 15 are not formed by intentionally controlling the position where ions migrate but result from the paths of random migration of individual ions, so that the frequency of appearance of the pore within the unit area of the substrate plane is dependent on Poisson distribution. More specifically, the number of intermediate electrodes 15 present in each cell is determined by Poisson distribution centered about the average value of 10.

Figure 4:
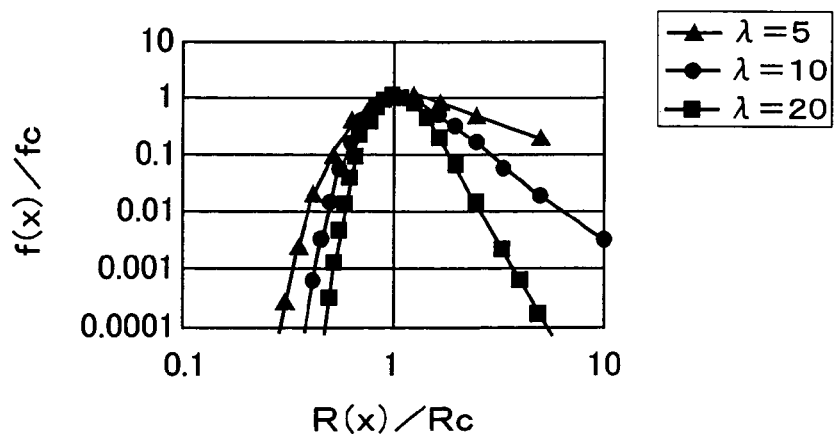
FIG. 4 is a graph showing resistance value distributions each determined by using as a parameter the average number of intermediate electrodes present in memory cells according to the first embodiment.

The fine pores 11a in the insulating substrate 11 used were diminished in the variations of size and almost identical in shape. Accordingly, variations in the resistance value of the memory cells MC can be calculated on the assumption that the intermediate electrodes 15 in the fine pores 11a have the same resistance value. FIG. 4 shows the results obtained using as a parameter the average number λ of intermediate electrodes 15 existing in each memory cell.

With reference to FIG. 4, plotted as abscissa is the standardizing resistance value R(x)/Rc vs. the relative frequency f(x)/f(c) as ordinate to show distributions of resistance values. Stated more specifically, when the average number of intermediate electrodes 15 is λ, R(x) is the resistance value in the case where the number of intermediate electrodes 15 is x, and Rc is the resistance value of the highest frequency (i.e., the resistance value when the number of intermediate electrodes 15 is λ). f(x) is the frequency with which the resistance value becomes R(x), and fc is the maximum value of f(x) (that is, the frequency with which the resistance value becomes Rc). Three values for the parameter λ are shown, i.e., 5 (triangle mark), 10 (circle mark) and 20 (square mark).

FIG. 4 reveals that as the value λ increases, the curve representing the resistance distribution extends over a narrower range, showing reduced variations in resistance value. Although not shown in FIG. 4, in the case of λ=1, the frequency with which R(x)/Rc becomes infinity, with x=0 is nearly the same as when x=1, giving rise to the problem that a considerable number of memory cells fabricated fail to operate. FIG. 4 reveals that in the case where λ=5, on the other hand, the number of memory cells failing to operate considerably decreases. Further it is seen that in the case where λ=10, the frequency of appearance of memory cells failing to operate decreases approximately to 1/1000 the frequency of appearance of memory cells exhibiting the average resistance value. In the case where λ=10, moreover, about 99% of the memory cells are within the range of resistance value variations of about an order of magnitude. The resistance value distributions actually measured were generally similar to the those of FIG. 4.

Figure 5:
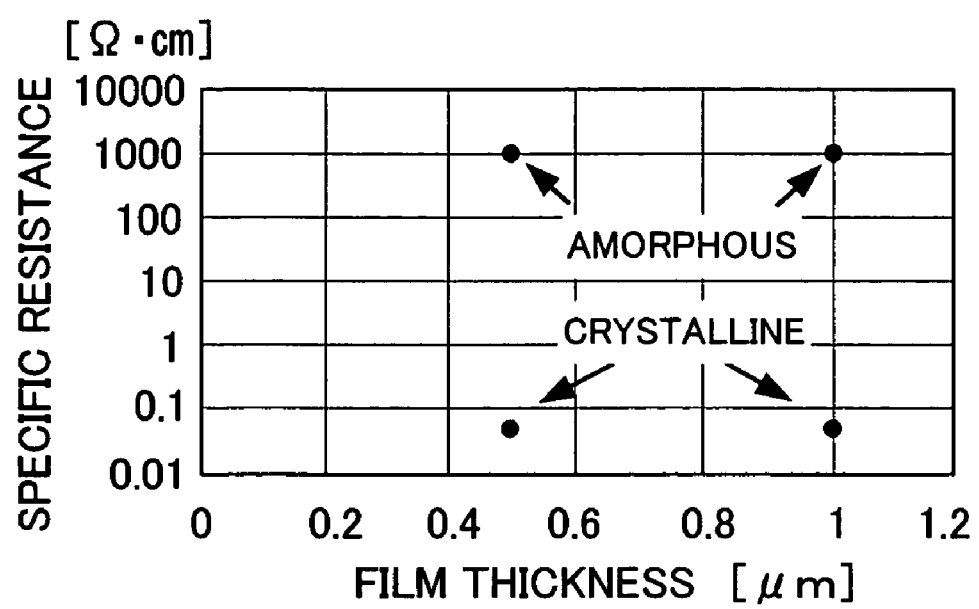
FIG. 5 is a diagram showing specific resistance values at varying film thicknesses of recording layers.

Next, variations in specific resistance due to the phase change of the recording layer between the amorphous state and the crystalline state were measured for comparison with the variations in the resistance value of the memory cells described above. The substrate used was made from Si, upper electrodes and lower electrodes were made from Pt, and the recording layers were prepared from Ge—Sb—Te. The recording layer as formed was in the amorphous state and checked for specific resistance with current of 10 μA. The Si substrate was then heat-treated in its entirety to crystallize the phase-change material of the recording layer, and the recording layer was checked for specific resistance with current of 1 mA. The measurement was made for two cases, i.e., for recording layers of 1 μm and 500 nm in thickness. FIG. 5 shows the results.

In FIG. 5, the thickness of the recording layer is plotted as abscissa, and the specific resistance values of the layer in the amorphous state and crystalline state as ordinate. FIG. 5 reveals that the specific resistance value of the memory material used in the present embodiment varies by at least four orders of magnitude regardless of the thickness of the layer.

The results described above indicate that even if variations of about an order of magnitude occur in the resistance owing to the fact that the number of intermediate electrodes 15 differs from memory cell to cell, the variations of the resistance value due to the phase change of the recording layer is fully detectable. In actuality, the entire memory material in the recording layer does not change in phase but the memory material in the vicinity of the junction of the material with the intermediate electrode changes. Accordingly, it is likely that the variations in the specific resistance of the memory material will not be greater than two orders of magnitude, whereas such variations are nevertheless detectable. In this case, the phase-change region of the recording layer can be made to extend from the vicinity of the junction of the memory material with the intermediate layer to the entire region of the material by optimizing the thickness of the recording layer or of the upper electrode, whereby the variation of resistance value can be increased nearly by four orders of magnitude.

However, variations in the thickness of the recording layer or in the thickness of the upper electrode exert a complex influence on the variations in the resistance value. For example when the recording layer is given a smaller thickness, the proportion of the thickness of the phase-change region to the thickness of the recording layer increases, consequently entailing the likelihood of increasing the variation of the resistance value. However, the junction of the intermediate electrode and the recording layer which is a heat generating portion is then positioned closer to the upper electrode having a greater heat conductivity than the memory material to entail an enhanced heat dissipating effect, with the result that the proportion of the thickness of the phase-change region to the thickness of the recording layer does not increase greatly. Thus, the variation of the resistance value will not always increase greatly.

Alternatively when the upper electrode is given a smaller thickness to reduce the effect to dissipate heat from the upper electrode, the resistance value of the upper electrode will increase to result in the likelihood of relatively decreasing the variation of the resistance value due to a phase change.

In the case where the upper electrode is given an increased thickness to lower the resistance value of the upper electrode itself, on the other hand, an enhanced heat dissipating effect will result, similarly entailing the likelihood of decreasing the variation of the resistance value.

In view of these problems, therefore, it is necessary to determine an optimum value for the thickness of the recording layer or of the upper electrode. Further in order to optimize the variation of the resistance value of the memory material, it is of course useful not only to adjust the thickness of the recording layer or the thickness of the upper electrode but also to change the material for the upper electrode or the intermediate electrode for the control of the heat dissipating effect or the resistance value of the electrode.

As stated above, the variations in the number of intermediate electrodes present in the individual memory cells arranged appear as variations in the electric characteristics of the individual memory cells, whereas such variations are within a permissible range in view of the operation of the memory device.

Figure 6:
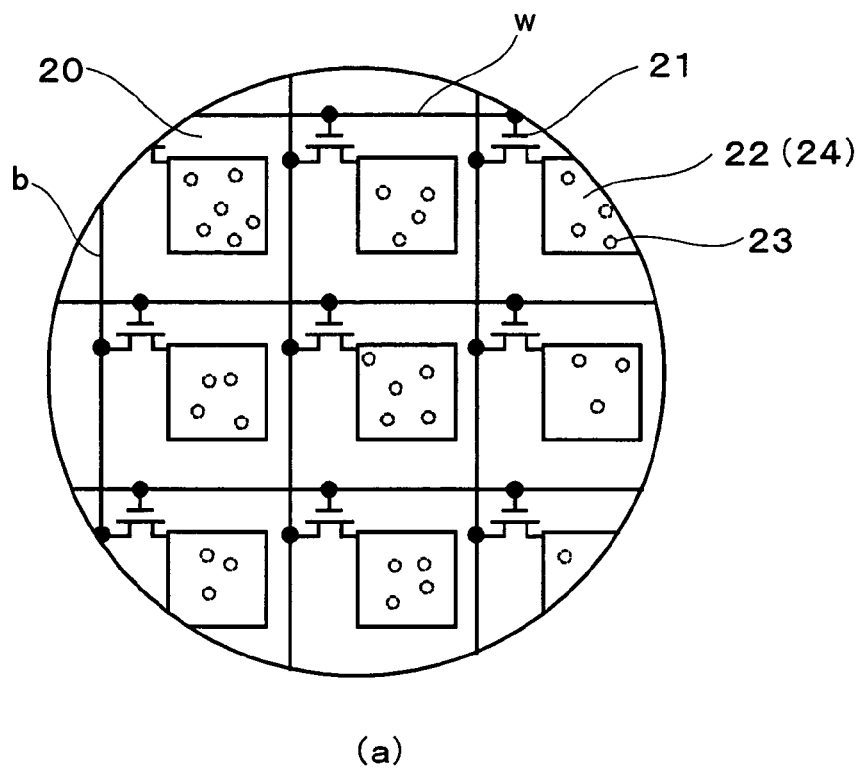
FIG. 6 shows a non-volatile memory according to another embodiment of the invention, (a) being a schematic plan view, (b) being a schematic bottom view.
Figure 6:
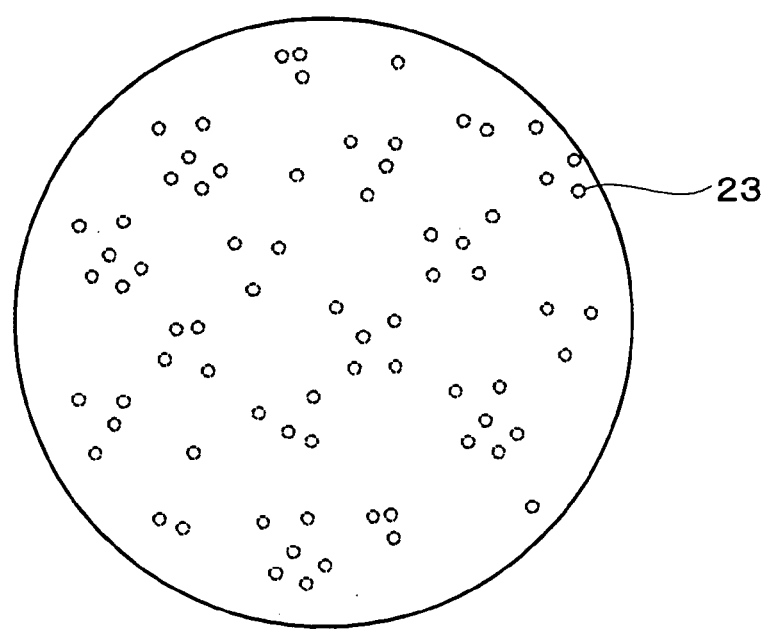

According to the present embodiment, the recording layer is made accessible by providing the upper electrode and the lower electrode respectively on the front and rear surfaces of the substrate. As shown in FIG. 6, however, the lower electrode need not always be provided if the recording layer is held between intermediate electrodes (first electrodes) and an upper electrode (second electrode).

FIG. 6 is a diagram schematically showing such a non-volatile memory, (a) being a plan view, (b) being a bottom view. Memory cells are defined by word lines w and bit lines b provided in the form of a matrix on an insulating substrate 20, and are each provided with an upper electrode (second electrode) 22. Electric pulses are applicable to the upper electrode 22 via a transistor 21 serving as a switching element. The insulating substrate 20 has fine pores filled with respective intermediate electrodes (first electrodes) 23. A recording layer 24 comprising a phase-change material is held between the upper electrode 22 and the intermediate electrodes 23. The intermediate electrodes 23 are common on the other surface side (not in contact with the recording layer 24) of the insulating substrate 20. The arrangement described above has the same advantage or effect as the embodiment described above.

Although the insulating substrate 11 of polycarbonate is used in the embodiment, an Si substrate is alternatively usable which comprises a thin film of $SiO_2$ having fine pores and produced, for example, by the process disclosed in U.S. Pat. No. 6,033,583. The Si substrate is usable for fabricating a similar non-volatile memory.

Although a phase-change material is used as the memory material for the recording layer of the embodiment, the memory material to be used is not particularly limited insofar as data can be written or erased by controlling the variation of the resistance value of the material due to the passage of current. For example, usable is an LB film of squarylium pigment [bis-(6-ocrylazurene)squarylium](Journal of Japan Society of Applied Physics, Vol. 63, No. 5, 1994, p. 470) which has been found to have an electric switching phenomenon. Although the mechanism of the switching phenomenon still remains to be clarified, use of finely divided intermediate electrodes serves to reduce the power consumption needed for switching.

Further according to the present embodiment, fine pores are randomly formed in the insulating substrate by irradiating the substrate with an ion beam perpendicular to the front surface thereof to produce defects in the substrate, and selectively etching the defects produced. This process is useful for quantity production. Fine pores can be formed in the insulating substrate alternatively by using a mask having a plurality of openings arranged randomly.

SECOND EMBODIMENT

According to this embodiment, studies were made to determine the preferred range of numbers of fine intermediate electrodes to be contained in the memory cells of the first embodiment. First, a non-volatile memory was fabricated by the process shown in FIG. 3.

Prepared as an insulating substrate 11 in the step shown in FIG. 3(a) was a membrane filter of polycarbonate having a thickness of 6 µm and a large number of fine pores 11a, 100 nm in diameter and formed substantially perpendicular to the surface thereof at a number density of $3\times10^8$ pores/cm$^2$. The fine pores 11a as arranged randomly were formed in the insulating substrate 11 by the step of irradiating a material film with a beam of ion or neutron high-energy particles perpendicular to the surface thereof to pass high-energy particles through the film and thereby produce defects in the film, and the step of selectively etching the defects produced.

According to a wiring design rule of 25 µm, Au was then deposited on the rear surface of the insulating substrate 11 to a thickness of 500 nm by sputtering using a metal mask to form lower electrodes 13 in the form of 25-µm-wide stripes in the step shown in FIG. 3(b). Before the deposition of Au, a thin film of Cr or like metal can be deposited on the substrate to ensure improved adhesion of the electrodes to the substrate.

Next in the step shown in FIG. 3(c), the inside walls defining the fine pores 11a were electroplated with Rh using a sulfuric acid Rh plating solution, with the lower electrodes 13 serving as cathodes, to provide intermediate electrodes 15 in the insulating substrate 11. Although the intermediate electrodes 15 are formed by Rh electroplating according to the present embodiment, Pt, Pd, Ni, Co, Ru, Cu or the like is usable for plating.

In the step shown in FIG. 3(d) and following the completion of plating, a memory material comprising $Ge_2Sb_2Te_5$ was deposited to a thickness of 200 nm by sputtering on the insulating substrate 11 using a metal mask to form recording layers 14, and Au was thereafter deposited on the layers 14 to a thickness of 500 nm by sputtering to form upper electrodes 12 in the form of 25-µm-wide stripes. At this time, a metal mask was placed in an adjusted direction so that the upper electrodes 12 and the lower electrodes 13 would have their lengths arranged orthogonal to each other. In this way, a non-volatile memory was fabricated as shown in FIG. 1.

The region of the lap of the upper electrode 12 and the lower electrode 13 corresponds to one memory cell, so that assuming that the area of electrical contact between the upper electrode 12 and the recording layer 14 is a, $a=25\times25$ (µm$^2$). Further assuming that the area of electrical contact between the recording layer 14 and the intermediate electrode 15 is b, $b=\pi(0.1/2)^2$ (µm$^2$). When one memory cell has n intermediate electrodes 15, n is about 2000. More specifically, the nonvolatile memory of the present embodiment has the relationship of nb<a.

The non-volatile memory thus obtained was usable for writing, reading and erasing by applying electric pulses across the upper electrodes 12 and the lower electrodes 13. Data was written at a pulse width of 100 ns and pulse current of about 1 µA, while erasure was done at a pulse width of 50 ns and current of about 2 µA. The memory was usable for reading by applying electric pulses of 1 V with pulse current of about 10 nA in the set (ON) state or pulse current of about 1 nA in the reset (OFF) state. The resulting variation was satisfactory for detecting a phase change of the recording layer 14.

Prepared for comparison was an assembly comprising a pair of Au electrodes having the same width (25 µm) as in the present embodiment, a hollow cylindrical intermediate Rh electrode with a diameter of 25 µm which is approximate to the electrode width, and a recording layer comprising $Ge_2Sb_2Te_5$, the intermediate electrode and the memory material being held between the Au electrodes. The assembly was checked for operating power for writing and erasing to find that at least 100 mA was required. Thus, the non-volatile memory of the present invention is found to be greatly reduced in power consumption.

Next, studies were made to determine the preferred range of numbers of fine intermediate electrodes to be contained in the memory cells. First, the minimum value of the preferred range was determined as will be described below.

In the non-volatile memory described with reference to the present embodiment, the variations in the number of intermediate electrodes 15 present in the individual memory cells arranged appear as variations in the electric characteristics of the individual memory cells. The deviations of the numbers of intermediate electrodes 15 from the average value can be determined from Poisson distribution. The reason is that because the fine pores 11a having intermediate electrodes 15 embedded therein result from the paths of migration of individual ions (or neutrons) and because the migration of ions is random, the frequency of appearance of the pores in a unit area in the plane of substrate is in conformity with Poisson distribution. Poisson distribution has the feature of gradually becoming approximate to Gaussian distribution as the average value $\lambda$ increases.

Figure 7:
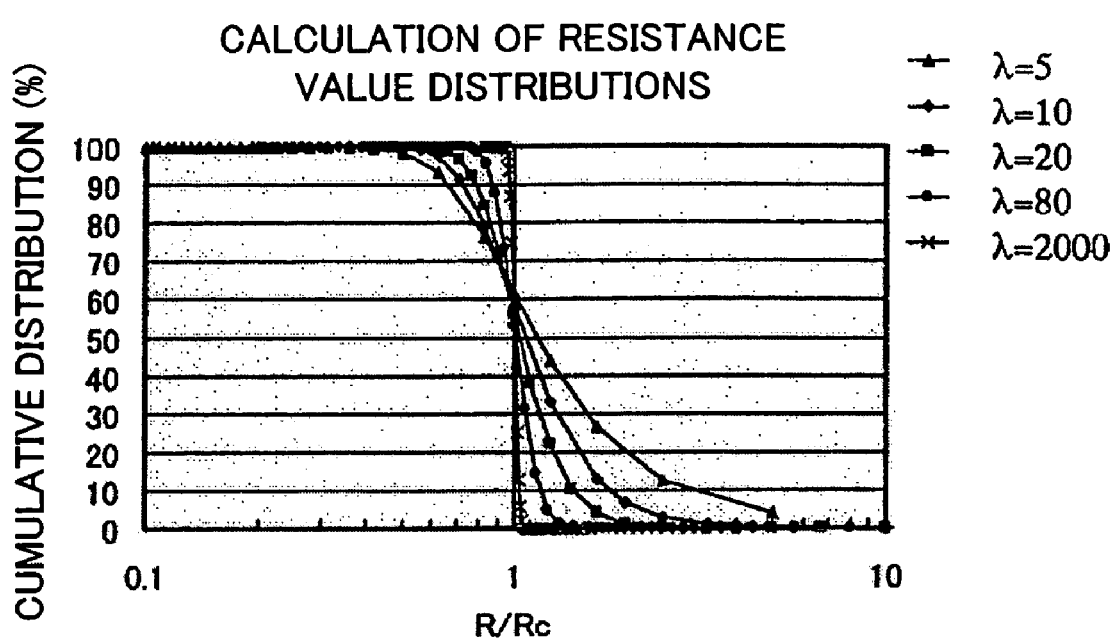
FIG. 7 is a graph showing resistance value distributions each determined by using as a parameter the average number of intermediate electrodes present in memory cells according to the second embodiment.

Since the individual fine pores 11a are diminished in variations in size and are nearly identical in shape, variations in the resistance value of memory cells were calculated on the assumption that the intermediate electrodes embedded in the respective pores exhibit nearly the same resistance value. FIG. 7 shows the results.

FIG. 7 wherein the standardizing resistance value R/Rc is plotted as abscissa vs. the cumulative distribution function F(n) as ordinate shows resistance value distributions using as a parameter the average number $\lambda$ of intermediate electrodes 15 existing in memory cells. Stated more specifically, in the case where the average number of intermediate electrodes 15 is $\lambda$, R is the resistance value when the number of intermediate electrodes 15 is n, and Rc is the resistance value of the highest frequency (i.e., the resistance value when the number of intermediate electrodes 15 is $\lambda$). F(n) is a cumulative distribution function of Poisson distribution as expressed in percentage. Five different values were used for the parameter $\lambda$, i.e., 5, 10, 20, 80, and 2000.

FIG. 7 shows the tendency that the variations in resistance value decrease as the value $\lambda$ increases. Although not shown in FIG. 7, in the case of $\lambda=1$, R=$\infty$, that is, the frequency with which the number of intermediate electrodes becomes zero is nearly the same as the frequency with which the number of intermediate electrodes becomes 1. Thus, there arises the problem that a considerable number of memory cells fabricated fail to operate. In the case where $\lambda$ is about 5, on the other hand, the number of memory cells failing to operate decreases as shown in FIG. 7. Further it is seen that in the case where $\lambda=10$, the frequency of appearance of memory cells failing to operate decreases approximately to 1/1000 the frequency of appearance of memory cells exhibiting the average resistance value. In the case where $\lambda=10$, moreover, about 99% of the memory cells are within the range of resistance value variations of about an order of magnitude. Accordingly, when the permissible range of variations in the resistance value of one memory cell is an order of magnitude and when it is required that about 99% of memory cells vary in resistance value within this permissible range (namely that about 99% of memory cells should operate), the minimum number of intermediate electrodes to be contained in one memory cell is approximately ten.

Figure 8:
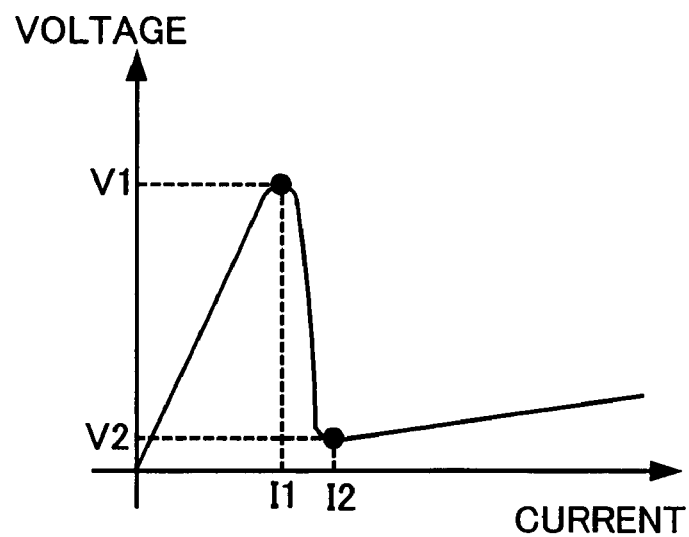
FIG. 8 is a diagram showing the current-voltage characteristics of a recording layer in the case where one intermediate electrode is present in one memory cell.

Next, the maximum value of the preferred range of numbers of intermediate electrodes to be contained in the memory cells was determined as follows. First, a structure wherein one intermediate electrode exists in one memory cell was checked for currant-voltage characteristics during the passage of current in the case where the initial state of the phase-change material of the recording layer 14 was amorphous (high resistance state). FIG. 8 shows the result.

With reference to FIG. 8, when the value of current to be passed through the memory cell is gradually increased from zero, the cell exhibits variations in conformity with Ohm's law until the current value increases to a predetermined value of I1. Suppose the voltage value corresponding to the current value I1 is V1. At this time, the resistance value R1 becomes V1/I1. With a further increase in the current value, the voltage drops, exhibiting negative resistance, and decreases to a minimum at a predetermined current value of I2. The cell thereafter exhibits variations conforming to Ohm's law again. Supposed the voltage value corresponding to the current value I2 is V2. The resistance value R2 at this time is V2/I2. As will be apparent from FIG. 8, R1>R2. The ratio of R1 to R2 results mainly from the variation of resistance value due to a phase change of the recording layer 14. The resistance value of the phase-change material $Ge_2Sb_2Te_5$ varies by four orders of magnitude when switched between the amorphous state and the crystalline state, and this variation rate is generally the same when other phase-change materials are used. Accordingly, the ratio of the resistance values detected when data is written to and read from the memory can be expected to be as large as four orders of magnitude. However, the recording layer 14 contains components remaining unaltered in resistance value, so that giving a ratio of four orders of magnitude between the resistance value of the amorphous state and that of the crystalline state requires optimization of the phase-change material, and material, thickness, etc. of the upper and lower electrodes as previously state.

Figure 9:
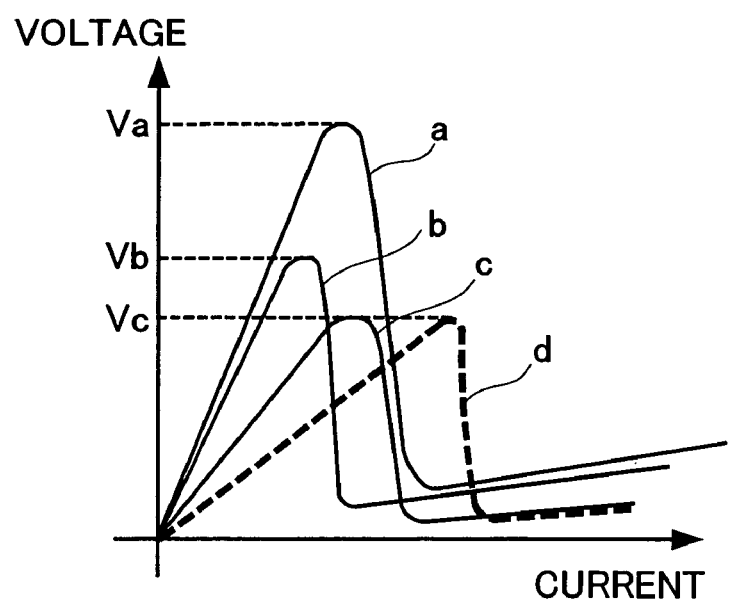
FIG. 9 is a diagram showing the current-voltage characteristics of a recording layer in the case where three intermediate electrodes are present in one memory cell.

Next, a structure wherein one memory cell has a plurality of intermediate electrodes, for example, three intermediate electrodes, was checked for currant-voltage characteristics during the passage of current. FIG. 9 shows the result.

With reference to FIG. 9, curves a, b and c represent the current-voltage characteristics of the respective intermediate electrodes. Since the intermediate electrodes having these characteristics are connected in parallel in one memory cell, the memory cell exhibits the characteristics represented by a curved.

In the initial region wherein the curves a to c exhibit variations according to Ohm's law when the value of current to be passed through the memory cell is gradually increased from zero, the cell is in a state wherein three simple resistors are connected in parallel, so that the curve d shows ohmic nature corresponding to the combined resistance. The curve d in the initial region has a low resistance value and therefore has a gentler slope than the curves a to c in the initial region.

When the voltage increases to the lowest Vc of the voltages Va to Vc corresponding to the maximal points of the curves a to c with a further increase in the current value, the phase-change material in the vicinity of the intermediate electrode having the characteristics of the curve c starts to decrease in resistance value. At this time, the phase-change material in the vicinity of the intermediate electrodes having the characteristics of the respective curves a and b retains a high resistance value. Because the intermediate electrodes are connected in parallel, the current to be passed through the memory cell almost entirely flows through the intermediate electrode corresponding to the curve c. As a result, the characteristics of the curve d after the voltage Vc is reached are nearly the same as the characteristics of the curve c after the voltage Vc is reached, and the corresponding portions of these curves are almost identical in shape. Even if the current value is thereafter increased on the curve d, the voltage will not reach Va or Vb because of the low resistance value, and the portions of the phase material in the vicinity of the intermediate electrodes having the characteristics of the curves a and b are unlikely to decrease in resistance.

The memory cell wherein a plurality of intermediate electrodes exist has the following feature. The cell has a lower resistance value in the amorphous state than the memory cell having one intermediate electrodes, while the former cell exhibits approximately the same resistance value as the cell having one intermediate electrode after the cell is switched to the crystalline state to exhibit a lower resistance value.

When one memory cell has n intermediate electrodes, these electrodes can be regarded as being connected in parallel. Accordingly it is thought that the initial resistance value (resistance value in the amorphous state) reduces approximately to 1/n. With a memory cell wherein a resistance value variation of four orders of magnitude is available when n=1, the resistance value varies by about an order of magnitude when n is a three-digit number, thus imposing limitations on the reading of resistance value variations. Stated more specifically, to obtain resistance value variations of about an order of magnitude if lowest, the number of intermediate electrodes in one memory cell is up to about 1000 if greatest. If it is considered that designation of the number of orders only is fully useful, the maximum number of electrodes is up to about 4000. In the case where the memory cell has such a large number of intermediate electrodes, variations in the number of intermediate electrodes from cell to cell are very small and negligible.

According to the present embodiment, one memory cell has on the average 2000 intermediate electrodes with a diameter of 100 nm, and resistance value variations of an order of magnitude are available even in this case. The above discussion indicates that the resistance value will expectedly vary by two orders of magnitude if the number of intermediate electrodes as reduced is on the order of 100. Accordingly, the width of lower electrodes 13 was reduced from 25 μm to 5 μm and the area of memory cells was reduced to ⅕ to thereby decrease the number of intermediate electrodes from 2000 to 400. When the memory thus obtained was checked for variations in resistance value due to ON/OFF switching, the resistance value varied by two order of magnitude. This substantiates that the foregoing discussion as to the preferred range of numbers of intermediate electrodes is justifiable.

As a conclusion, the above discussion as to the number of orders indicates that the number of fine intermediate electrodes to be contained in the memory cell is preferably $0.5 \times 10^1$ to $4 \times 10^3$, more preferably $10^1$ to $10^3$.

While the preferred number of intermediate electrodes to be contained in each of memory cells has been discussed above, there is also the preferred range of areas to be occupied by the intermediate electrodes in the memory cell. Assuming that S1 is the total area of contact of the portions of the intermediate electrodes contained in each of memory cells with the recording layer, S1 is preferably $10^2$ to $10^8$ (nm$^2$). Further assuming that the area of the recording layer contained in the optional cell is S2, S1/S2 is preferably in the range of $10^{-4}$ to $10^{-1}$.

THIRD EMBODIMENT

The non-volatile memories according to the foregoing embodiments can be reduced in power consumption for writing and erasing, and are therefore useful for various applications. These memories are usable, for example, for paper displays as shown in FIG. 10.

Figure 10:
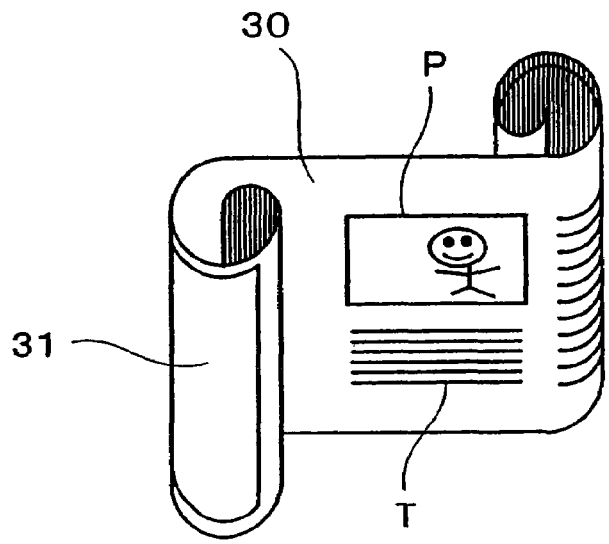
FIG. 10 is a perspective view schematically showing the construction of a paper display comprising a non-volatile memory of the invention.
Figure 11:
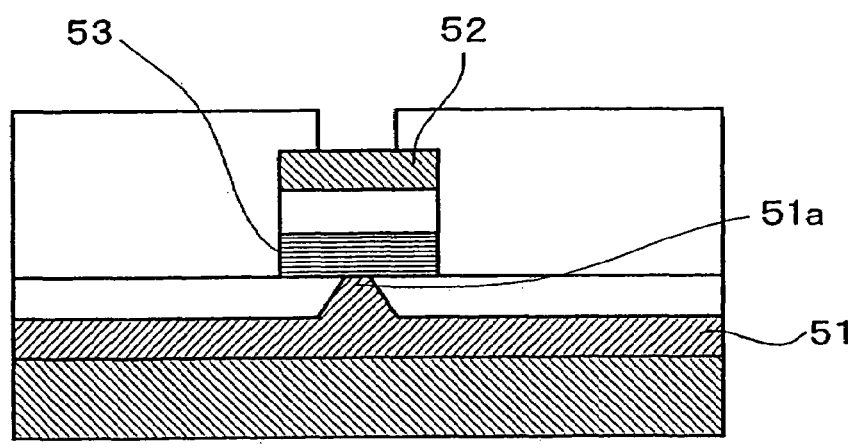
FIG. 11 is a fragmentary view in section showing the construction of a conventional non-volatile memory.

FIG. 10 shows a paper display 30 comprising a non-volatile memory 31 having a polycarbonate substrate and provided on the rear side of the display, and a screen provided on the front side thereof for presenting characters T and images P. The paper display 30 can be fabricated using known techniques disclosed, for example, JP, A No. 1999-502950. Used as the non-volatile memory 31 is one according to the first embodiment. The characters T and images P to be shown on the paper display 30 can be stored in the memory 31 as data, which is transferred automatically or manually to the display 30, whereby the displayed characters T or images P can be altered or changed.

In this way, the data to be displayed is stored in the non-volatile memory which is amenable to the deformation of the paper display which can be folded or rolled up. Characters and images can therefore be altered or changed without impairing the deformability of the paper display.

INDUSTRIAL APPLICABILITY

As described above, the present invention provides non-volatile memories which can be reduced in power consumption and which have great freedom of design and high reliability. The non-volatile memory of the invention can therefore be used as affixed, for example, to a flexible paper display or a display in the form of a thin plate for storing therein the data to be displayed to give the display improved portability.

The invention claimed is:

1. A non-volatile memory having a plurality of memory cells, the non-volatile memory comprising:
    an insulating substrate having a plurality of first electrodes extending therethrough from a front surface of the substrate to a rear surface thereof,
    one or more second electrodes formed above the front surface of the substrate, and
    a recording layer disposed between the first electrodes and the second electrode and variable in resistance value by electric pulses applied across the first electrodes and the second electrode,
    wherein at least one of the plurality of memory cells comprises at least one of the plurality of first electrodes, the recording layer and at least one of the second electrode and the plurality of first electrodes are electrically connected to the recording layer in a region constituting the memory cell,
    wherein the memory cells contain different numbers of the first electrodes, and the average number of the first electrode contained in each of the memory cells is from $0.5 \times 10^1$ to $4 \times 10^3$.

2. The non-volatile memory according to claim 1, wherein the one or more second electrodes are provided in a form of stripes, and third electrodes are provided in a form of stripes on the rear surface of the insulating substrate and extend orthogonal to the second electrodes when viewed from above, each of the third electrodes being electrically connected to at least some of the first electrodes, and overlapping regions of the second electrodes and the third electrodes when viewed from above constitute the memory cells in the respective overlapping regions.

3. The non-volatile memory according to claim 1, wherein the recording layer comprises a phase-change material having at least two stable phases different in resistance value and capable of being reversibly switched between the phases.

4. The non-volatile memory according to claim 3, wherein the phase-change material contains a chalcogenide material.

5. The non-volatile memory according to claim 1, wherein the first electrodes are randomly arranged relative to the insulating substrate.

6. The non-volatile memory according to claim 1, wherein each of the first electrodes has a diameter of 5 to 500 nm.

7. The non-volatile memory according to claim 1, wherein assuming that S1 is the total area of contact of the portions of the first electrodes contained in the memory cell with the recording layer and that S2 is the area of the recording layer contained in the memory cell, S1/S2 is in a range of $10^{-4}$ to $10^{-1}$.

8. The non-volatile memory according to claim 1, wherein the recording layer comprises Ge—Sb—Te, and each of the first electrodes comprising at least one of rhodium (Rh), platinum (Pt), palladium (Pd), nickel (Ni), cobalt (Co), chromium (Cr), rhenium (Re), iridium (Ir) and gold (Au).

9. The non-volatile memory according to claim 1, wherein the insulating substrate is a polycarbonate substrate.

10. A paper display comprising the non-volatile memory according to claim 1.

* * * * *